United States Patent [19]

Takasugi

[11] Patent Number: 4,646,272

[45] Date of Patent: Feb. 24, 1987

[54] DATA I/O CIRCUIT WITH HIGHER INTEGRATION DENSITY FOR DRAM

[75] Inventor: Atsushi Takasugi, Tokyo, Japan

[73] Assignee: Oki Electric Industry Co., Ltd., Tokyo, Japan

[21] Appl. No.: 706,944

[22] Filed: Mar. 1, 1985

[30] Foreign Application Priority Data

Mar. 2, 1984 [JP] Japan .................................. 59-38758

[51] Int. Cl.$^4$ ........................ G11C 7/00; G11C 11/24
[52] U.S. Cl. .................................... 365/233; 365/190; 365/239
[58] Field of Search ............... 365/189, 190, 230, 233, 365/239, 240, 149

[56] References Cited

U.S. PATENT DOCUMENTS 4,562,555  12/1985  Ouchi et al. ......................... 365/189
4,567,579   1/1986  Patel et al. .......................... 365/189

FOREIGN PATENT DOCUMENTS 0220294  12/1983  Japan ................................... 365/230
0116988   7/1984  Japan ................................ 365/205 X Primary Examiner—Stuart N. Hecker
Assistant Examiner—Glenn A. Gossage
Attorney, Agent, or Firm—Wenderoth, Lind & Ponack

[57] ABSTRACT

A data input/output circuit operates in an operation cycle in which, when a first latch circuit connected to a first data bus issues 1-bit information to a data output buffer, next 1-bit information is latched in a second latch circuit connected to a second data bus and simultaneously the first data bus is precharged, and in an operation cycle in which, when 1-bit data stored in the second latch circuit is issued to the data output buffer, next 1-bit data is latched in the first latch circuit and simultaneously the second data bus is precharged. Therefore, when one of the latch circuits issues data to the data output buffer, the other latch circuit latches data and is in a standby condition. An access time in which to issue data from bit lines to the data buses is greatly reduced notwithstanding the only two data buses are employed. Accordingly, the chip area occupied by the data buses can be reduced appreciably.

5 Claims, 5 Drawing Figures

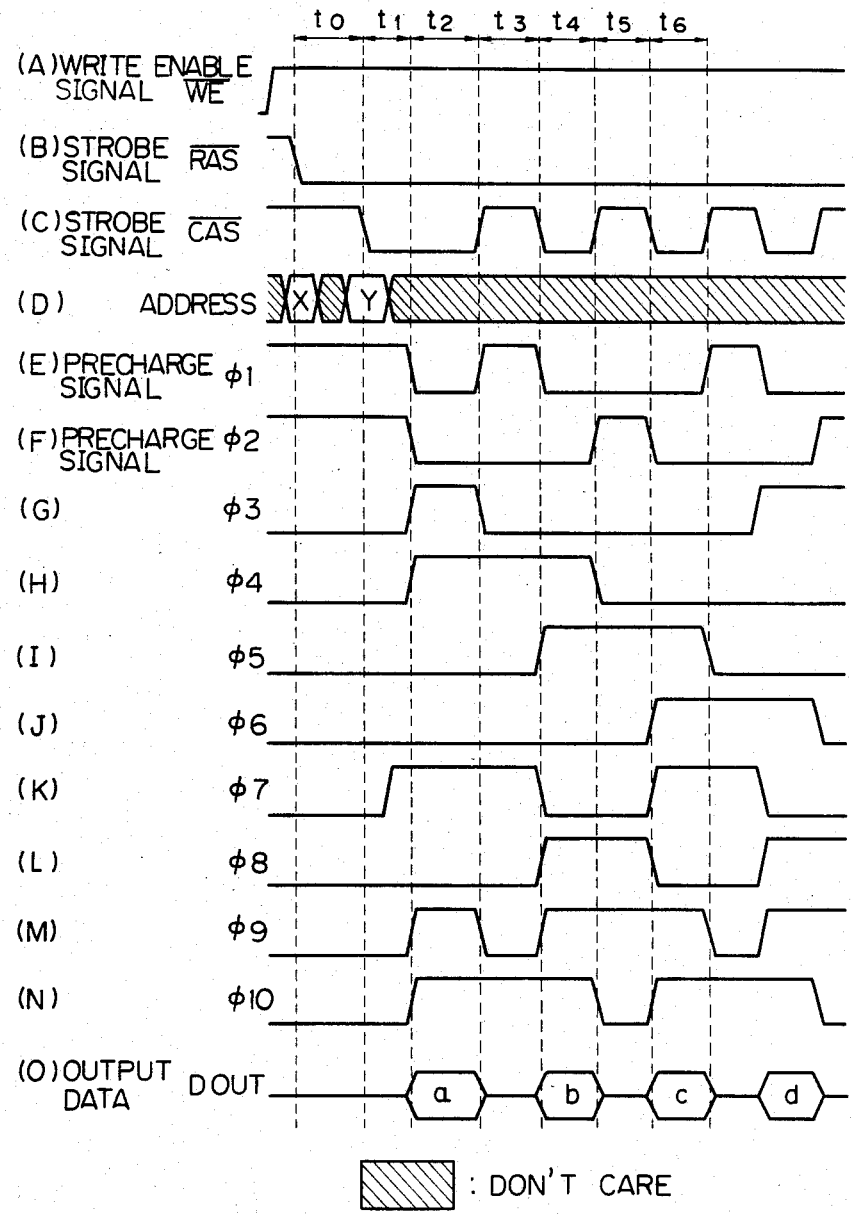

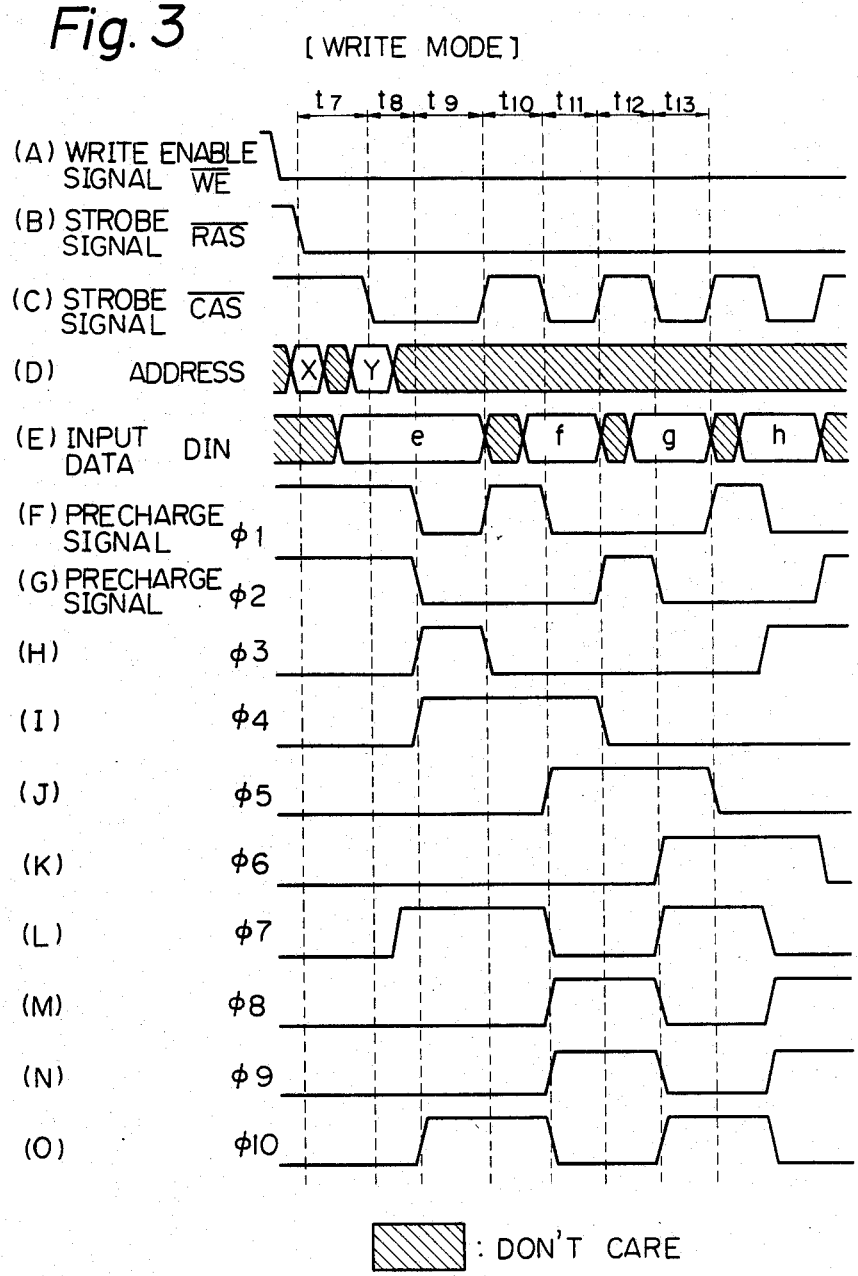

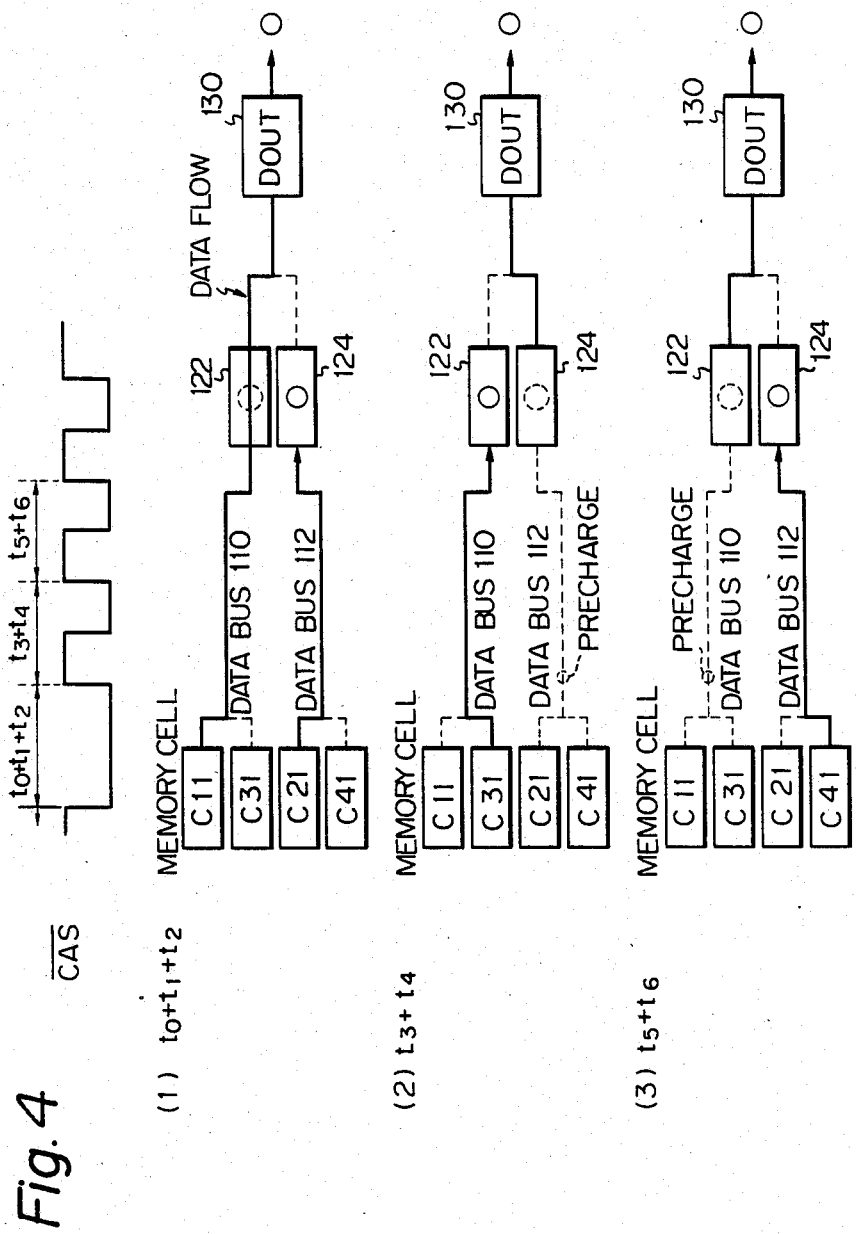

DATA I/O CIRCUIT WITH HIGHER INTEGRATION DENSITY FOR DRAM

BACKGROUND OF THE INVENTION

The present invention relates to a data input/output circuit operable in a multibit mode, suitable for a MOS dynamic RAM.

One method for shortening an access time of semiconductor DRAM ICs is to use a data input/output circuit operable in a multibit mode, e.g., a 4-bit (nibble) mode.

When a memory address is specified once, the input/output circuit can transfer 4-bit data serially at a high speed from a memory cell to a data output buffer or from a data output buffer to a memory cell.

Conventional data input/output circuits operating in the nibble mode are disclosed in, for example, "A 100 ns 256K DRAM with Page-Nibble Mode" by K. Shimotori et al., ISSCC DIGEST OF TECHNICAL PAPERS, P228-229; Feb., 1983, and "A sub 100 ns 256Kb DRAM" by T. Nakano et al., ISSCC DIGEST OF TECHNICAL PAPERS, P224-225; Feb., 1983.

The conventional data input/output circuits operate in a readout mode to transfer four bits of information from four bit lines to four data buses at a time, the four bits of information being amplified and latched respectively in four latch circuits Then, the four bits of information are transferred one bit by one bit serially from the latch circuits to a data output buffer After all data of the four data buses have been transmitted to a data output circuit, next 4-bit information is transferred to the data buses.

With the prior nibble-mode data input/output circuit, however, while data is being issued from one latch circuit, the other latch circuits are kept simply in a standby condition. Therefore, the operation efficiency of the data buses and the latch circuits is not high. In particular, where a plurality of such prior data input/output circuits are employed to issue pieces of serial information in a parallel manner to a plurality of data output terminals, there are required as many data buses, precharge circuits, and latch circuits as a multiple of the data output terminals, and the area taken up by the data input/output circuits is greatly increased. For these reasons, it has been difficult to fabricate high-capacity DRAM IC devices.

The conventional circuit arrangement has also been disadvantageous in that when multibit (four bits or more) data is to be accessed serially through the data output terminals, it is necessary to increase the number of data buses by the number of bits, with the result that the area occupied by the data buses makes it difficult to provide higher-density integration on semiconductor memory IC chips.

SUMMARY OF THE INVENTION

It is an object of the present invention to provide a data input/output circuit with high integration density, operable in a multibit mode.

Another object of the present invention is to provide a data input/output circuit capable of accessing at a high speed N-bit serial data through two data buses.

According to the present invention, there is provided a data input/output circuit for serially accessing N-bit data (N>4) for a DRAM circuit, comprising: a first data bus composed of a pair of conductors for transferring data; a second data bus composed of a pair of conductors for transferring data; a first precharge circuit for charging the first data bus in response to a first timing control signal; a second precharge circuit for charging the second data bus in response to a second timing control signal; a first group of N/2 switches independently controllable by a group of third timing control signals, respectively, the switches of the first group being coupled between respective bit lines and the first data bus for transferring 1-bit information on the bit lines to the first data bus in response to the respective third timing control signals; a second group of N/2 switches independently controllable by a group of fourth timing control signals, respectively, the switches of the second group being coupled between the respective bit lines and the second data bus for transferring 1-bit information on the bit lines to the first data bus in response to the fourth timing control signals; a first latch circuit for latching and amplifying the information on the first data bus under the control of a fifth timing control signal; a second latch circuit for latching and amplifying the information on the second data bus under the control of a sixth timing control signal; third switch means for selectively issuing output information of the first latch circuit under the control of a seventh timing control signal; fourth switch means for selectively issuing output information of the first latch circuit under the control of an eighth timing control signal; a data output buffer for converting the output information from the third or fourth switch means into 1-bit information and issuing the same under the control of one logic level of an enable signal; and a timing signal generator circuit for generating the first, second, fifth, sixth, seventh, eighth timing control signals and the groups of third and fourth timing control signals.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 2 is a timing chart of control signals in a readout mode of the memory circuit shown in FIG. 1;

FIG. 3 is a timing chart of control signals in a write mode of the memory circuit shown in FIG. 1; and FIG. 4 is a set of data-flow diagrams illustrating data paths in the readout mode of the data input/output circuit of the present invention.

DETAILED DESCRIPTION

Figure 1A:
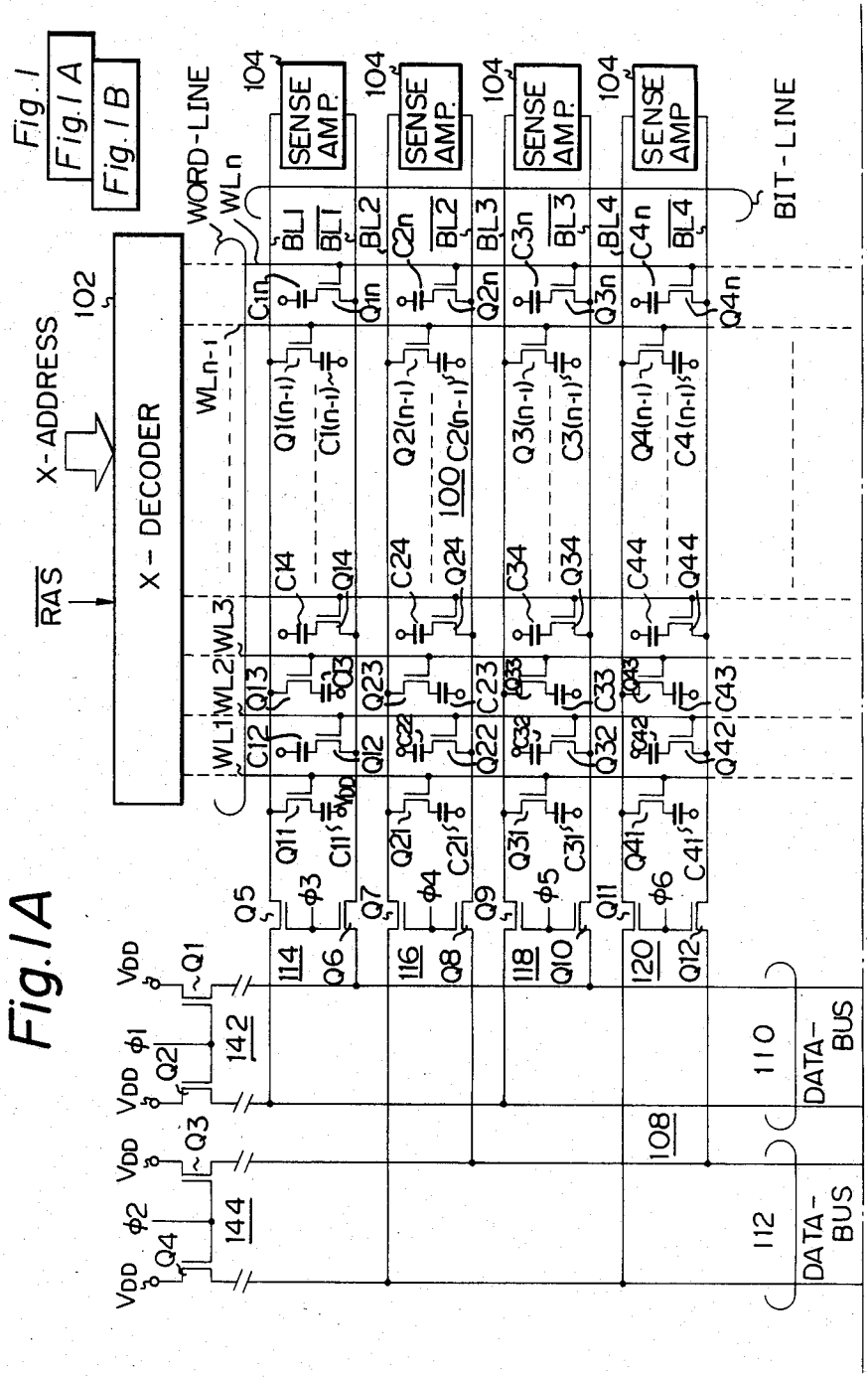
FIG. 1 is a circuit diagram, partly in block form, of a MOS DRAM IC including a data input/output circuit operable in a nibble mode according to the present invention.
Figure 1B:
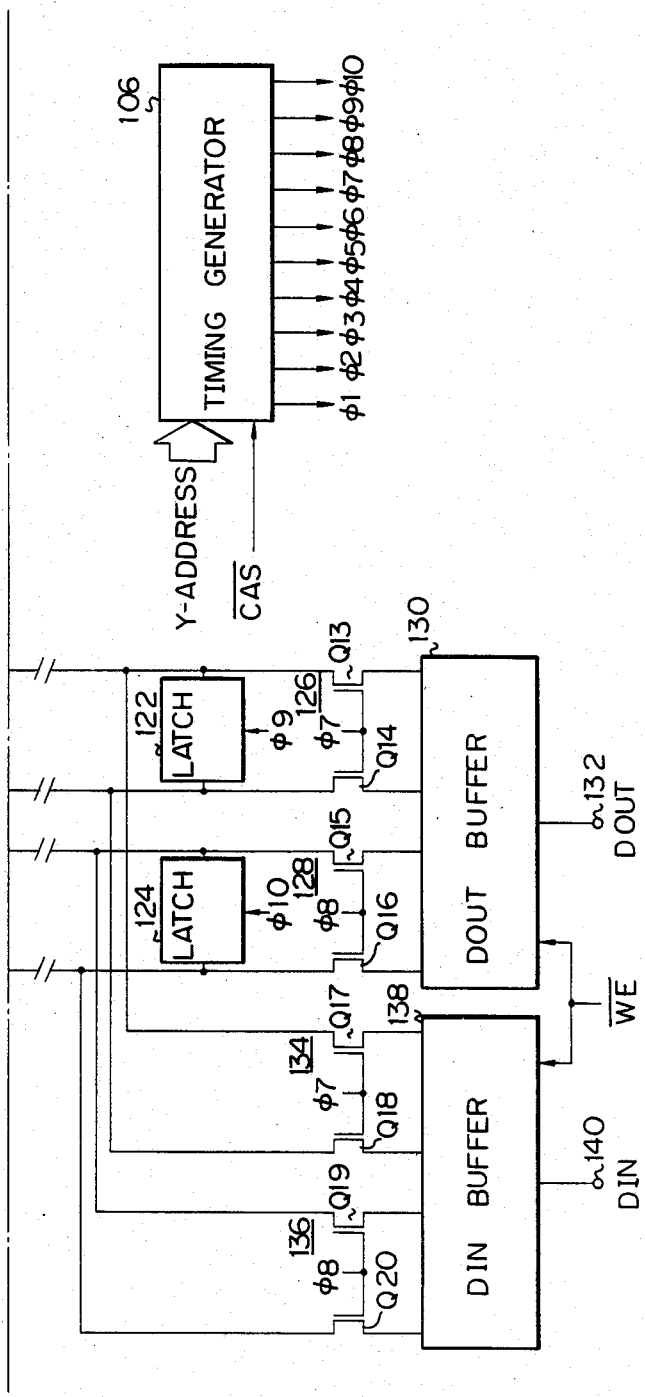

FIG. 1 shows a MOS DRAM circuit including a data input/output circuit operable in a nibble mode according to the present invention.

As shown in FIG. 1, the MOS DRAM circuit includes a memory array 100, an X decoder 102 responsive to a strobe signal $\overline{RAS}$ for receiving an X address signal to select one of word lines $W_L$ of the memory array 100, a plurality of sense amplifiers 104 for amplifying signals from bit lines $B_L$ of the memory array 100, a timing generator circuit 106 responsive to a strobe signal $\overline{CAS}$ for receiving a Y address signal to issue control signals $\phi_1$ through $\phi_{10}$, and a data input/output circut 108 for control the transmission of data (information) between data input/output terminals and the bit lines $B_L$. The timing generator circuit 106 includes a Y address decoder for generating timing signals $\phi_3$ through $\phi_6$.

The memory array 100 comprises a plurality of memory cells each composed of a switching MOS transistor Q and a memory capacitor C.

The data input/output circuit 108 includes a data bus 110 composed of a pair of conductors, switch circuits 114, 118 for selectively coupling the bit lines $B_{L1}$, $\overline{B_{L1}}$, $B_{L3}$, $\overline{B_{L3}}$ with the data bus 110 and controlled by the control signals $\phi_3$ and $\phi_5$, a data bus 112 composed of a pair of conductors, and switch circuits 116, 120 for selectively coupling the bit lines $B_{L2}$, $\overline{B_{L2}}$, $B_{L4}$, $\overline{B_{L4}}$ with the data bus 112 and controlled by the control signals $\phi_4$ and $\phi_6$. Each of these switch circuits 114, 116, 118, 120 is composed of MOS transistors.

The data input/output circuit 108 further includes a latch circuit 122 responsive to the control signal $\phi_9$ for amplifying and latching data of the data bus 110, a latch circuit 124 responsive to the control signal $\phi_{10}$ for amplifying and latching data of the data bus 112, a switch circuit 126 responsive to the control signal $\phi_7$ for issuing the data of the data bus 110, a switch circuit 128 responsive to the control signal $\phi_8$ for issuing the data of the data bus 112, and a data output buffer 130 responsive to an "H"-level enable signal $\overline{WE}$ for issuing one of complementary signals from the data bus 110 or one of complementary signals from the data bus 112 to a data output terminal 132. The switch circuits 126, 128 are composed of MOS transistors $Q_{13}$, $Q_{14}$ and $Q_{15}$, $Q_{16}$, respectively.

The data input/output circuit 108 also includes a switch circuit 134 connected to the data bus 110 and controlled by the control signal $\phi_7$, a switch circuit 136 connected to the data bus 112 and controlled by the control signal $\phi_8$, a data input buffer 138 responsive to an "L"-level enable signal $WE_1$ for converting data from a data input terminal 140 into complementary signals and transmitting these complementary signals to the switch circuit 134 or 136, a precharge circuit 142 for charging the data bus 110 up to a power supply potential $V_{DD}$ in response to the control signal $\phi_1$, and a precharge circuit 144 for charging the data bus 112 up to the power supply potential $V_{DD}$ in response to the control signal $\phi_2$. The switch circuits 134, 136 are composed of MOS transistors $Q_{17}$, $Q_{18}$ and $Q_{19}$, $Q_{20}$, respectively. The precharge circuits 142, 144 are composed of MOS transistors $Q_1$, $Q_2$ and $Q_3$, $Q_4$, respectively.

Operation of the data input/output circuit according to the present invention will be described with reference to the timing diagrams of FIGS. 2 and 3.

Readout mode:

As shown in FIG. 2, when the control signals $\phi_1$, $\phi_2$ are of an "H" level, the MOS transistors $Q_1$, $Q_2$, $Q_3$, $Q_4$ are rendered conductive to charge the data buses 110, 112 to the power supply potential $V_{DD}$. Since the write enable signal $\overline{WE}$ is of the "H" level at this time, the data output buffer 130 is enabled and the data input buffer 138 is disenabled.

When the strobe signal $\overline{RAS}$ changes from the "H" level to the "L" level during a period $t_0$, the X address circuit 102 receives the X address signal to select the word line $W_{L1}$, for example. At the same time, the sense amplifiers 104 detect and amplify data from the bit lines $B_L$, respectively.

When the strobe signal $\overline{CAS}$ changes from the "H" level to the "L" level during a next period $t_1$, the Y address signal is applied to the timing generator circuit 106. The control signal $\phi_7$ is now caused to change from the "L" level to the "H" level to render the MOS transistors $Q_{13}$, $Q_{14}$ conductive. As the control signal $\phi_8$ is of the "L" level, the MOS transistors $Q_{15}$, $Q_{16}$ remain nonconductive.

During a period $t_2$, the control signals $\phi_1$, $\phi_2$ change from the "H" level to the "L" level to render the MOS transistors $Q_1$ through $Q_4$ nonconductive. The control signals $\phi_3$, $\phi_4$ change from the "L" level to the "H" level to render the transistors $Q_5$, $Q_6$, $Q_7$, $Q_8$ conductive, to thereby transmit information from the bit lines $BL_1$, $\overline{BL_1}$ and $BL_2$, $\overline{BL_2}$ to the data buses 110, 112, respectively. The control signals $\phi_5$, $\phi_6$ are kept in the "L" level to maintain the transistors $Q_9$ through $Q_{12}$ non-conductive. The data buses 110, 112 are therefore disconnected from the bit lines $BL_3$, $\overline{BL_3}$ and $BL_4$, $\overline{BL_4}$, respectively. Since the control signals $\phi_9$, $\phi_{10}$ change from the "L" level to the "H" level, the latch circuits 122, 124 are activated to latch and amplify the data from the data buses 110, 112. At this time, the transistors $Q_{13}$, $Q_{14}$ are energized, and the data from the data bus 110 is issued through the data output buffer 130 to the data output terminal 132 (see a waveform (O) of in FIG. 2).

When the strobe signal $\overline{CAS}$ changes from the "L" level to the "H" level during a period $t_3$, the transistors $Q_5$, $Q_6$ are de-energized. Since the control signal $\phi_1$ changes from the "L" level to the "H" level, the transistors $Q_1$, $Q_2$ are energized to precharge the data bus 110. As the control signal $\phi_9$ goes from the "H" level to the "L" level, the latch circuit 122 is reset and an output of the data output buffer 130 becomes a high-impedance condition.

When the strobe signal $\overline{CAS}$ goes from the "H" level to the "L" level during a period $t_4$, the control signal $\phi_7$ changes from the "H" level to the "L" level, and the control signal $\phi_8$ changes from the "L" level to the "H" level. Therefore, the data from the data bus 112 is issued through the data output buffer 130 to the data output terminal 132 (see b in waveform (O) of FIG. 2). Inasmuch as the control signal $\phi_1$ changes from the "H" level to the "L" level, the transistors $Q_1$, $Q_2$ are de-energized. The control signal $\phi_5$ changes from the "L" level to the "H" level, so that the transistors $Q_9$, $Q_{10}$ are energized to transfer the data from the bit lines $B_{L3}$, $\overline{B_{L3}}$ to the data bus 110. The control signal $\phi_9$ changes from the "L" level to the "H" level, activating the latch circuit 122 to latch and amplify the data of the data bus 110.

In a period $t_5$, the strobe signal $\overline{CAS}$ goes from the "L" level to the "H" level and the control signal $\phi_2$ goes from the "L" level to the "H" level, whereupon the transistors $Q_3$, $Q_4$ are energized to precharge the data bus 112. Since the control signal $\phi_4$ changes from the "H" level to the "L" level to de-energize the transistors $Q_7$, $Q_8$, the bit lines $B_{L2}$, $\overline{B_{L2}}$ are disconnected from the data bus 112. As the control signal $\phi_{10}$ goes from the "H" level to the "L" level, the latch circuit 124 is reset.

The control signal $\phi_7$ changes from the "L" level to the "H" level and the control signal $\phi_8$ changes from the "H" level to the "L" level during a period $t_6$, with the result that the data from the data bus 110 is issued via the data output buffer 130 to the data output terminal 132 (see c in waveform (O) of FIG. 2). Since the control signal $\phi_6$ changes from the "L" level to the "H"

level, the transistors $Q_{11}$, $Q_{12}$ are energized to transfer the data from the bit lines $B_{L4}$, $\overline{B}_{L4}$ to the data bus 112. When the control signal $\phi_{10}$ changes from the "L" level to the "H" level, the latch citcuit 124 is activated to latch and amplify the data of the data bus 112.

Likewise, the data items from the data buses 110, 112 are alternately and serially issued to the data output terminal 132 by the control signals $\phi_3$, $\phi_4$, $\phi_5$, $\phi_6$ and $\phi_9$, $\phi_{10}$.

FIG. 4 shows flow diagrams of data flow in the readout mode of the data input/output circuit according to the present invention.

Write mode:

A write mode of the data input/output circuit of the present invention will be described with reference to FIG. 3.

First, an "L"-level enable signal $\overline{WE}$ is applied to disenable the data output buffer 130 and enable the data input buffer 138.

When the strobe signal $\overline{RAS}$ goes from the "H" level to the "L" level during a period $t_7$, the X address circuit 102 receives an X address signal to select the word line $W_{L1}$, for example. At the same time, the sense amplifiers 104 detect and amplify data of the bit lines $B_L$, respectively.

When the strobe signal $\overline{CAS}$ changes from the "H" level to the "L" level during a period $t_8$, a Y address signal is impressed on the timing generator circuit 106. The control signal $\phi_7$ is now caused to change from the "L" level to the "H" level to thereby energize the MOS transistors $Q_{17}$, $Q_{18}$. Since the control signal $\phi_8$ is of the "L" level, the MOS transistors $Q_{19}$, $Q_{20}$ remain de-energized. A 1-bit signal applied to the data input terminal 140 is introduced into the data input buffer 138 which issues complementary signals (see e in waveform (E) of FIG. 3). Since the control signal $\phi_7$ goes from the "L" level to the "H" level at this time, the transistors $Q_{17}$, $Q_{18}$ are energized to connect the data input buffer 138 to the data bus 110.

In a period $t_9$, the control signals $\phi_1$, $\phi_2$ change from the "H" level to the "L" level to de-energize the transistors $Q_1$, $Q_2$, $Q_3$, $Q_4$ for thereby interrupting the precharging of the data buses 110, 112. Since the control signals $\phi_3$, $\phi_4$ go from the "L" level to the "H" level, the bit lines $B_{L1}$, $\overline{B}_{L1}$ are connected to the data bus 110, and the bit lines $B_{L2}$, $\overline{B}_{L2}$ are connected to the data bus 112. Because the control signal $\phi_9$ is of the "L" level, the latch circuit 122 is disenabled. The control signal $\phi_{10}$ goes from the "L" level to the "H" level, the latch circuit 124 amplifies the data of the data bus 112 and refreshes information in the memory capacitor $C_{21}$ of the bit lines $B_{L2}$, $\overline{B}_{L2}$. Simultaneously, the information to be written is delivered from the data input buffer 138 onto the data bus 110 and then written in the memory cell $C_{11}$ of the bit lines $B_{L1}$, $\overline{B}_{L1}$.

During a next period $t_{10}$, the strobe signal $\overline{CAS}$ varies from the "L" level to the "H" level and the control signal $\phi_1$ goes from the "L" level to the "H" level. The transistors $Q_1$, $Q_2$ are now energized to precharge the data bus 110 to the power supply potential. At the same time, the control signal $\phi_3$ changes from the "H" level to the "L" level to de-energize the transistors $Q_5$, $Q_6$ thus disconnecting the bit lines $B_{L1}$, $\overline{B}_{L1}$ from the data bus 110.

During a period $t_{11}$, the strobe signal $\overline{CAS}$ varies from the "H" level to the "L" level and the control signal $\phi_1$ goes from the "H" level to the "L" level, thereby interrupting the precharging of the data bus 110. The data is then introduced from the data input terminal 140 into the data input buffer 138 (see f in waveform (E) of FIG. 3). The control signal $\phi_7$ goes from the "H" level to the "L" level to de-energize the transistors $Q_{17}$, $Q_{18}$, and simultaneously the control signal $\phi_8$ goes from the "L" level to the "H" level to energize the transistors $Q_{19}$, $Q_{20}$. The data from the data input buffer 138 is then delivered to the data bus 112. Since the control signal $\phi_{10}$ goes from the "L" level to the "H" level, the latch circuit 124 is disenabled. The control signal $\phi_4$ is of the "H" level for thereby writing the data of the data bus 112 in the memory cell $C_{21}$. The control signal $\phi_5$ changes from the "L" level to the "H" level to energize the transistors $Q_9$, $Q_{10}$ for transferring information from the bit lines $B_{L3}$, $\overline{B}_{L3}$ to the data bus 110. Inasmuch as the control signal $\phi_9$ goes from the "L" level to the "H" level, the latch circuit 122 is activated to latch and amplify the information on the data bus 110 and refresh information in the memory capacitor $C_{31}$. The control signal $\phi_4$ changes from the "H" level to the "L" level to de-energize the transistors $Q_7$, $Q_8$. The control signal $\phi_2$ goes to the "H" level to precharge the data bus 112.

During a period $t_{13}$, the strobe signal $\overline{CAS}$ goes from the "H" level to the "L" level to introduce next data from the data input terminal 140 into the data input buffer 138 (see g in waveform (E) of FIG. 3). The control signal $\phi_7$ goes from the "L" level to the "H" level to energize the transistors $Q_{17}$, $Q_{18}$, and simultaneously the control signal $\phi_8$ goes from the "H" level to the "L" level to de-energize the transistors $Q_{19}$, $Q_{20}$. The data from the data input buffer 138 is then delivered to the data bus 110. Since the control signal $\phi_5$ is of the "H" level at this time, data from the data bus 110 is written into the memory capacitor $C_{31}$ of the bit lines $B_{L3}$, $\overline{B}_{L3}$. The transistors $Q_3$, $Q_4$ are deenergized since the control signal $\phi_2$ goes from the "H" level to the "L" level. The control signal $\phi_6$ changes from the "L" level to the "H" level to energize the transistors $Q_{11}$, $Q_{12}$, thereby transferring data from the bit lines $B_{L4}$, $\overline{B}_{L4}$ to the data bus 112. As the control signal $\phi_{10}$ goes from the "L" level to the "H" level, the latch circuit 124 is activated to latch and amplify the information on the data bus 112 and refresh information in the memory capacitor $C_{41}$.

Likewise, data items applied to the data input terminal 140 are transferred alternately to the data buses 110, 112 and written into memory cells.

As described above, where data readout in response to a single addressing operation is to be carried out under time-sharing control, the data input/output circuit of the present invention operates in an operation cycle in which, when the first latch circuit connected to the first data bus issues 1-bit information to the data output buffer, next 1-bit information is latched in the second latch circuit connected to the second data bus and simultaneously the first data bus is precharged, and in an operation cycle in which, when 1-bit data stored in the second latch circuit is issued to the data output buffer, next 1-bit data is latched in the first latch circuit and simultaneously the second data bus is precharged. Therefore, the data input/output circuit is advantageous in that, when one of the latch circuits issues data to the data output buffer, the other latch circuit latches data and is in a standby condition, and hence an access time in which to issue data from the bit lines to the data buses is greatly reduced notwithstanding the only two data buses are employed. Accordingly, the chip area occupied by the data buses can be reduced appreciably.

The data input/output circuit according to the present invention is highly effective when used with large-capacity semiconductor DRAM IC devices.

The data input/output circuit is conducive to miniaturization of IC chips since the number of required data buses can be greatly lowered when issuing serial data from each of a plurality of I/O buffers.

Further, even if the number of bit lines connected to the two data buses is increased to increase the number of bits of serial data, a large-capacity, high-speed DRAM IC device can be realized according to the present invention without involving an increase in the number of data buses, through timing control of the switch means precharge means, and latch circuits between the bit lines and the data buses.

Although a certain preferred embodiment has been shown and described, it should be understood that many changes and modifications may be made therein without departing from the scope of the appended claims.

What is claimed is:

1. A data input/output circuit for serially accessing N-bit data (N≧4) for a DRAM circuit, comprising:
   (a) a first data bus composed of a pair of conductors for transferring data;
   (b) a second data bus composed of a pair of conductors for transferring data;
   (c) a first precharge circuit for charging said first data bus in response to a first timing control signal;
   (d) a second precharge circuit for charging said second data bus in response to a second timing control signal;
   (e) a first group of N/2 switches independently controllable by a group of third timing control signals, respectively, said switches of the first group being coupled between respective bit lines and said first data bus for transferring 1-bit information on said bit lines to said first data bus in response to the respective third timing control signals;
   (f) a second group of N/2 switches independently controllable by a group of fourth timing control signals, respectively, said switches of the second group being coupled between the respective bit lines and said second data bus for transferring 1-bit information on said bit lines to said first data bus in response to the fourth timing control signals;
   (g) a first latch circuit for latching and amplifying the information on said first data bus under the control of a fifth timing control signal;
   (h) a second latch circuit for latching and amplifying the information on said second data bus under the control of a sixth timing control signal;
   (i) third switch means for selectively issuing output information of said first latch circuit under the control of a seventh timing control signal;
   (j) fourth switch means for selectively issuing output information of said first latch circuit under the control of an eighth timing control signal;
   (k) a data output buffer for converting the output information from said third or fourth switch means into 1-bit information and issuing the same under the control of one logic level of an enable signal; and
   (l) a timing signal generator circuit for generating said first, second, fifth, sixth, seventh, eighth timing control signals and said groups of third and fourth timing control signals.

2. A data input/output circuit according to claim 1, further including fifth switch means coupled to said first data bus and controllable by said seventh timing control signal, sixth switch means coupled to said second data bus and controllable by said eighth timing control signal, and a data input buffer for converting 1-bit input information into complementary signals and transferring the same to said fifth and sixth switch means under the control of another logic level of said enable signal.

3. A data input/output circuit according to claim 1, wherein each of said first and second precharge circuits, said N/2 switches of said first and second groups, and said third and fourth switch means comprises MOS transistors.

4. A data input/output circuit according to claim 3, wherein said first group of N/2 switches comprises two first switches, and said second group of N/2 switches comprises two second switches.

5. A data input/output circuit according to claim 3, having a readout cycle in which, when said first latch circuit latches second data of said first data bus, first data of said second latch circuit is issued through said data output buffer and said second data bus is precharged, and when said second latch circuit latches third data, said second data latched by said second latch circuit is issued through said output data buffer and said first data bus is precharged.

* * * * *